(12) United States Patent
McHugh et al.

(10) Patent No.: US 7,991,169 B2
(45) Date of Patent: Aug. 2, 2011

(54) CHARGE/DISCHARGE CONTROL CIRCUIT FOR AUDIO DEVICE

(75) Inventors: Colin B. McHugh, Somerville, MA (US); Olafur Mar Josefsson, North Reading, MA (US)

(73) Assignee: Analog Devices, Inc., Norwood, MA (US)

( * ) Notice: Subject to any disclaimer, the term of this patent is extended or adjusted under 35 U.S.C. 154(b) by 588 days.

(21) Appl. No.: 11/475,265

(22) Filed: Jun. 27, 2006

(65) Prior Publication Data
US 2007/0030038 A1   Feb. 8, 2007

Related U.S. Application Data

(60) Provisional application No. 60/695,101, filed on Jun. 29, 2005.

(51) Int. Cl.
*H04B 15/00* (2006.01)
(52) U.S. Cl. .................. 381/94.5; 381/94.1; 330/149
(58) Field of Classification Search ............... 381/94.5, 381/58, 55, 94.1, 94.7, 94.8, 83, 93, 94.9, 381/96; 330/51, 149; 327/535, 536
See application file for complete search history.

(56) References Cited

U.S. PATENT DOCUMENTS

| | | | |
|---|---|---|---|
| 4,205,575 A | 6/1980 | Hoskinson et al. | |
| 5,391,999 A | 2/1995 | Early et al. | |
| 5,428,687 A * | 6/1995 | Willcocks et al. | 381/18 |
| 5,495,200 A | 2/1996 | Kwan et al. | |
| 5,644,257 A | 7/1997 | Kerth et al. | |
| 5,724,000 A | 3/1998 | Quinn | |
| 5,796,851 A | 8/1998 | Hewitt et al. | |
| 6,118,399 A | 9/2000 | Krone | |
| 6,522,278 B1 * | 2/2003 | Rhode et al. | 341/144 |
| 6,538,590 B1 | 3/2003 | Gaboriau et al. | |
| 6,542,024 B1 * | 4/2003 | Somayajula | 327/535 |
| 6,693,491 B1 | 2/2004 | Delano | |
| 6,774,684 B2 * | 8/2004 | Wu et al. | 327/134 |
| 7,224,218 B1 * | 5/2007 | Jiang et al. | 330/10 |
| 7,259,619 B2 * | 8/2007 | Chang et al. | 330/51 |
| 7,312,654 B2 | 12/2007 | Roechner et al. | |
| 2005/0140432 A1 | 6/2005 | Nair et al. | |

FOREIGN PATENT DOCUMENTS

| | | |
|---|---|---|
| EP | 0570655 A1 | 11/1993 |
| JP | 58-194425 A | 11/1983 |
| WO | WO-2005/039041 | 4/2005 |

OTHER PUBLICATIONS

International Search Report for PCT Application No. PCT/US06/24841, mailed Jul. 16, 2008, 1 page.
Written Opinion for PCT Application No. PCT/US06/24841, mailed Jul. 16, 2008, 5 pages.

(Continued)

*Primary Examiner* — Vivian Chin
*Assistant Examiner* — Jason R Kurr
(74) *Attorney, Agent, or Firm* — Bingham McCutchen LLP

(57) ABSTRACT

A charge/discharge control circuit for controlling current through an input/output audio device includes a first voltage reference; a second voltage reference and a waveform generation circuit responsive to the first and second voltage references for generating a multi-stage waveform profile which is approximately an inaudible waveform for suppressing audible artifacts in the input/output device.

24 Claims, 13 Drawing Sheets

OTHER PUBLICATIONS

Supplementary European Search Report and Opinion for European Patent Application No. 06774029.0, mailed Apr. 16, 2009, 8 pages.

"Variable Power Supply Output Voltage by Micro Processor Unit Upgrade Card," IBM Technical Disclosure Bulletin, IBM Corp., New York, US, vol. 38, No. 5, May 1, 1996, pp. 439-440.

English translation of the Office Action and Search Report for Taiwan Patent Application No. 095123559, mailed May 7, 2009, 7 pages.

English translation of the Office Action for Taiwan Patent Application No. 095123559, mailed Dec. 8, 2009, 2 pages.

Thomsen et al. "A 11-dB-THD, 18-mW DAC Using Sampling of the Output and Feedback to Reduce Distortion," IEEE Journal of Solid-State Circuits, IEEE Service Center, Piscataway, NJ, US, vol. 34, No. 12, Dec. 1999, pp. 1733-1740.

International Search Report for PCT Application No. PCT/US06/24931, mailed Feb. 27, 2007, 1 page.

Written Opinion for PCT Application No. PCT/US06/24931, mailed Feb. 27, 2007, 3 pages.

Supplementary European Search Report and Opinion for European Patent Application No. 06774080.3, mailed Jul. 14, 2009, 10 pages.

Examination Report and Opinion for European Patent Application No. 06774080.3, mailed Aug. 7, 2009, 7 pages.

English translation of the Office Action and Search Report for Taiwan Patent Application No. 095123983, mailed Mar. 5, 2009, 8 pages.

English translation of the Office Action for Chinese Patent Application No. 200680030177.X mailed Feb. 26, 2010, 3 pages.

\* cited by examiner

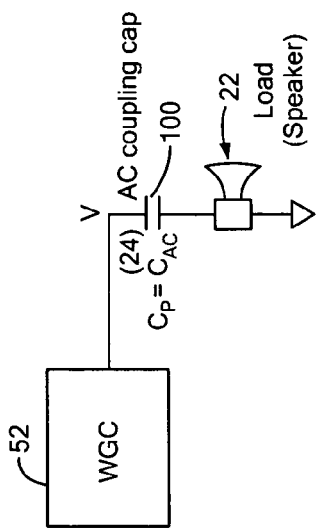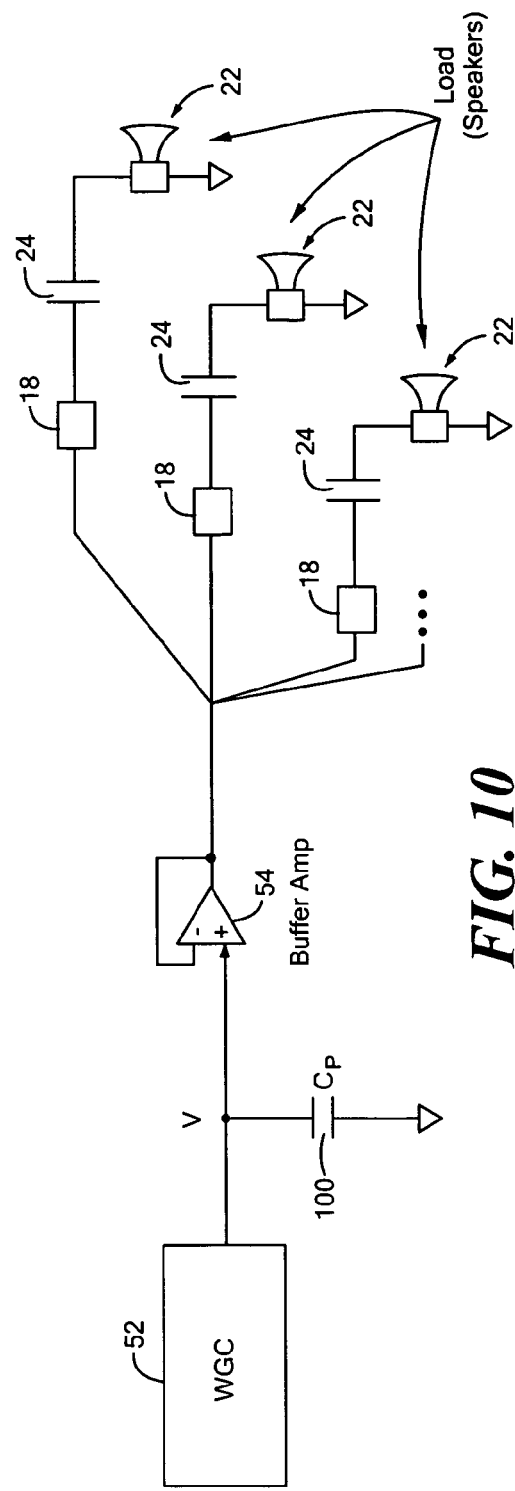
FIG. 9
FIG. 10

CHARGE/DISCHARGE CONTROL CIRCUIT FOR AUDIO DEVICE

RELATED APPLICATIONS

This application claims benefit of U.S. Provisional Application Ser. No. 60/695,101 filed Jun. 29, 2005, herein incorporated by this reference.

FIELD OF THE INVENTION

This invention relates to a charge/discharge control circuit for controlling current through an input/output audio device and more particularly to a dewhumper a/k/a de-whumper.

BACKGROUND OF THE INVENTION

In electronic devices that interface with audio devices through an a.c. coupling capacitance, a change in the DC state on either side of the a.c. coupling capacitor due to power-up, power-down or some other voltage transition can result in an audible artifact due to charging/discharging of the a.c. coupling capacitor, which causes current to flow through the a.c. coupling capacitor and the audio device. For example, codec systems are used to drive input and output devices, e.g. speakers, headphones, amplifiers, microphones, CD players. The I/O contacts of the codec generally connect through a.c. coupling capacitors to the particular input and output devices. When a codec is powered up or down, the change in voltage across the a.c. coupling capacitor causes a glitch which can be heard as an annoying "click", "pop", or "whump" sound if the device has an audio output, e.g. speaker, headphone. Even if the device is a CD player, amplifier or microphone, the sound may be heard if the subsequent components do not suppress it. The particular sound, "click", "pop", or "whump," depends on the frequency content of charging current induced by the voltage transition across the a.c. coupling capacitor.

In one prior art attempt to overcome this problem, upon a power-up or power-down command, the common mode generator circuit of the codec was switched directly to the input/output contacts and the RC time constant of the common mode capacitance and impedance of the common mode generator modulated the "glitch," but the "glitch" was still present and there was cross-talk introduced through the switches. Another shortcoming is that the network of these switches and the a.c. coupling capacitances and input/output devices compounded other RC time constants with the previously mentioned one, which introduced delays so that there was a moderated glitch followed, after a short delay, by a second moderated glitch when the drive amplifiers are turned on/off. Another approach simply used external circuits such as clamping circuits on the ground side of the a.c. coupling capacitors to suppress any electrical artifacts due to charging/discharging of those capacitors.

SUMMARY OF THE INVENTION

It is therefore an object of this invention to provide an improved charge/discharge control circuit for controlling current through an input/output audio device.

It is a further object of this invention to provide such an improved charge/discharge control circuit which reduces unwanted audible artifacts yet provides fast charging and discharging of the a.c. coupling capacitors.

It is a further object of this invention to provide such an improved charge/discharge control circuit which greatly reduces or eliminates the need for external clamping circuits.

It is a further object of this invention to provide such an improved charge/discharge control circuit which operates over a wide range of profile capacitors.

It is a further object of this invention to provide such an improved charge/discharge control circuit which operates over a wide range of a.c. coupling capacitors.

It is a further object of this invention to provide such an improved charge/discharge control circuit which operates for a wide variety of audio input/output devices.

It is a further object of this invention to provide such an improved charge/discharge control circuit which is relatively small in silicon area.

It is a further object of this invention to provide such an improved charge/discharge control circuit which is relatively low in power consumption.

It is a further object of this invention to provide such an improved charge/discharge control circuit which does not introduce cross-talk.

The invention results from the realization that an improved charge/discharge control circuit for controlling current through an input/output audio device which reduces unwanted artifacts yet provides fast charging and discharging of the a.c. coupling capacitors can be effected with a waveform generation circuit responsive to first and second voltage references for generating a multistage voltage waveform profile which is approximately an inaudible current waveform for suppressing audible artifacts in the input/output device.

The subject invention, however, in other embodiments, need not achieve all these objectives and the claims hereof should not be limited to structures nor to methods capable of achieving these objectives.

This invention features a charge/discharge control circuit for controlling current through an input/output audio device including a first voltage reference and a second voltage reference. A waveform generation circuit responsive to the first and second voltage references generates a multi-stage waveform profile which is approximately an inaudible waveform for suppressing audible artifacts in the input/output device.

In a preferred embodiment the first voltage reference may include a common mode voltage and the second may include ground. The multistage waveform may include a generative stage followed by a degenerative stage. The magnitude of the slope of the generative stage may increase with time. The magnitude of the slope of the degenerative stage may decrease with time. The multistage waveform may include a preliminary stage. The preliminary stage may have a fixed slope. The waveform generation circuit may operate at power-up and the stages of the multi-stage waveform may have a positive slope. The waveform generation circuit may operate at power-down and the stages of the multi-stage waveform may have negative slopes. The waveform generation circuit may operate at power-up and may include a first current source, a profile capacitor and a first current mirror for charging the profile capacitor during the preliminary stage. It may include a second current mirror and a first positive feedback circuit responsive to an increase in voltage on the profile capacitor during the preliminary stage to increase the current charging the profile capacitor during the generative stage. In the degenerative stage the output legs of the current mirrors may respond to further elevated voltage on the profile capacitor to operate in the linear resistance region. The waveform generation circuit may operate at power-down and may include a second current source, the profile capacitor and a third current mirror for discharging the profile capacitor during the preliminary stage. It may include a fourth current mirror and a second positive feedback circuit responsive to a decrease in voltage on the profile capacitor during the preliminary stage to increase the current discharging the profile capacitor during the generative stage. In the degenerative stage the output legs of the current mirrors may respond to further decreased voltage on the profile capacitor to operate in the linear resistance range. The profile capacitor may be a common mode voltage capacitor. The input/output device may include an a.c. coupling capacitor and the profile capacitor may include the a.c. coupling capacitor. There may be a positive feedback pre-bias circuit for reducing the period of the preliminary stage. The waveform generation circuit may include a buffer amplifier associated with all the input/output devices or it may include a buffer amplifier associated with each of the input/output devices. The waveform generation circuit may be implemented using a digital to analog converter. The buffer amplifier may include audio drive amplifiers. The multi-stage waveform profile may be a voltage waveform. The inaudible waveform may be a voltage waveform. The multi-stage waveform profile may be approximately an integral of an inaudible waveform. The waveform profile may be a current waveform. The multistage waveform profile may be a current waveform profile.

This invention also features a charge/discharge control circuit for controlling current through an input/output audio device including a second voltage reference, a waveform generation circuit responsive to the first and second voltage references for generating a multi-stage waveform profile which is approximately an integral of an inaudible waveform for suppressing audible artifacts in the input/output device.

BRIEF DESCRIPTION OF THE DRAWINGS

Other objects, features and advantages will occur to those skilled in the art from the following description of a preferred embodiment and the accompanying drawings, in which:

FIG. 9 is a schematic block diagram of the waveform generation circuit of FIGS. 7 and 8 using the a.c. coupling capacitor as the profile capacitor;

FIG. 10 is a schematic block diagram of the waveform generation circuit of FIGS. 7 and 8 using a single buffer amplifier to service a number of input/output devices;

DISCLOSURE OF THE PREFERRED EMBODIMENT

Figure 1:
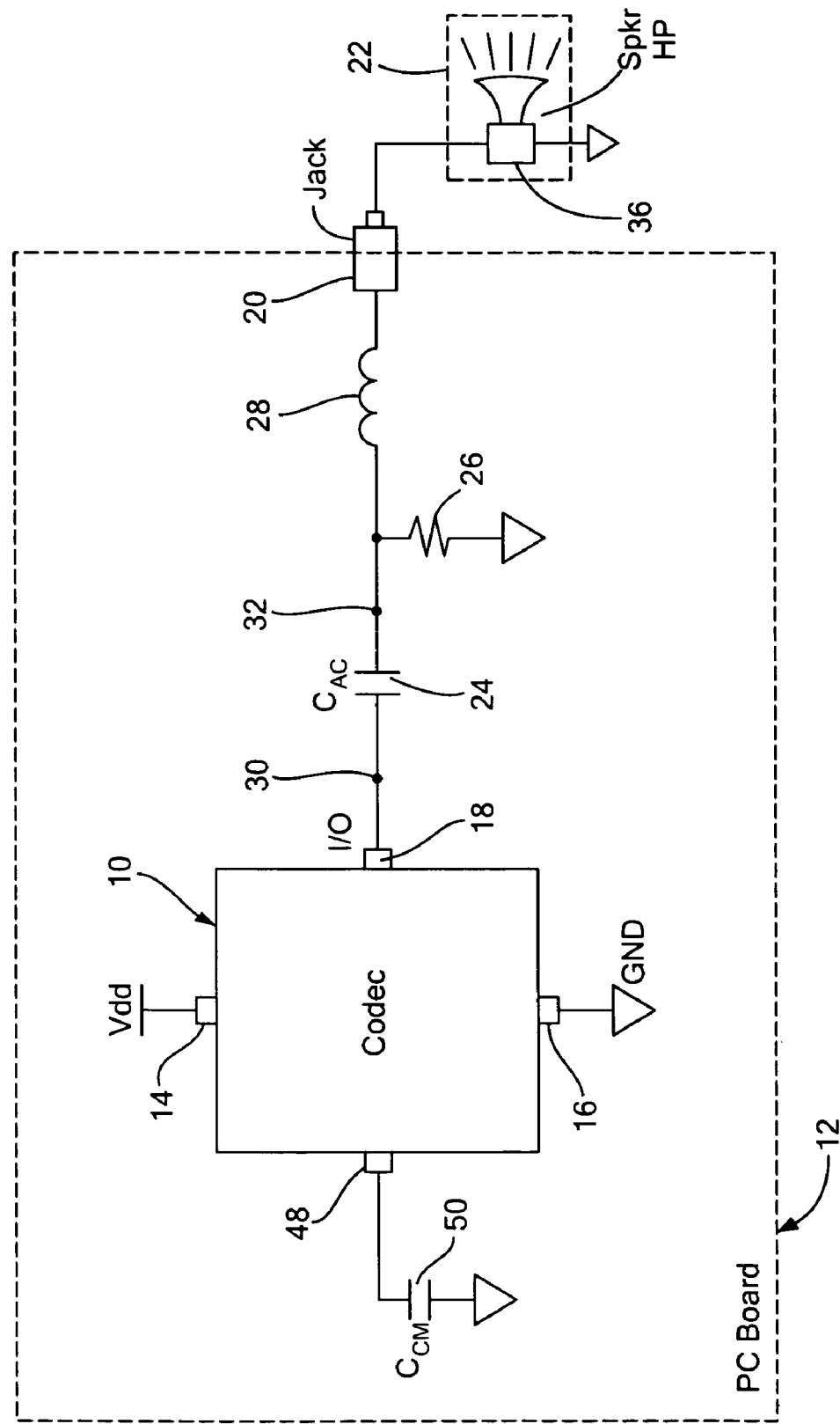
FIG. 1 is a schematic block diagram of a codec according to this invention mounted on a pc board and connected to an input/output device through an a.c. coupling capacitor.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

There is shown in FIG. 1 a codec 10 according to this invention installed on a PC board 12. Codec 10 is provided with two voltages, e.g. positive power supply vdd at terminal 14 and negative power supply GND at terminal 16. Codec 10 also has a contact 48 for signal conditioning of the common mode voltage by common mode capacitor $C_{cm}$ 50. Codec 10 typically has a number of I/O contacts 18 here represented by a single one, which provides an output through a jack 20, for example, to an input/output device 22, here shown as speaker 36. The output of codec 10 is provided through an a.c. coupling capacitor $C_{AC}$ 24 to jack 20. There may also be provided resistance 26 and an inductance 28.

Conventionally, at positive-going or negative-going voltage transitions, at the I/O contact 18 e.g. at power-up or power-down, the abrupt change in voltage at nodes 30, 32 induces a current that will flow through input/output device 22 which creates a problem when device 22 is an audio device such as a speaker 36, as it produces an audible artifact.

Figure 2:
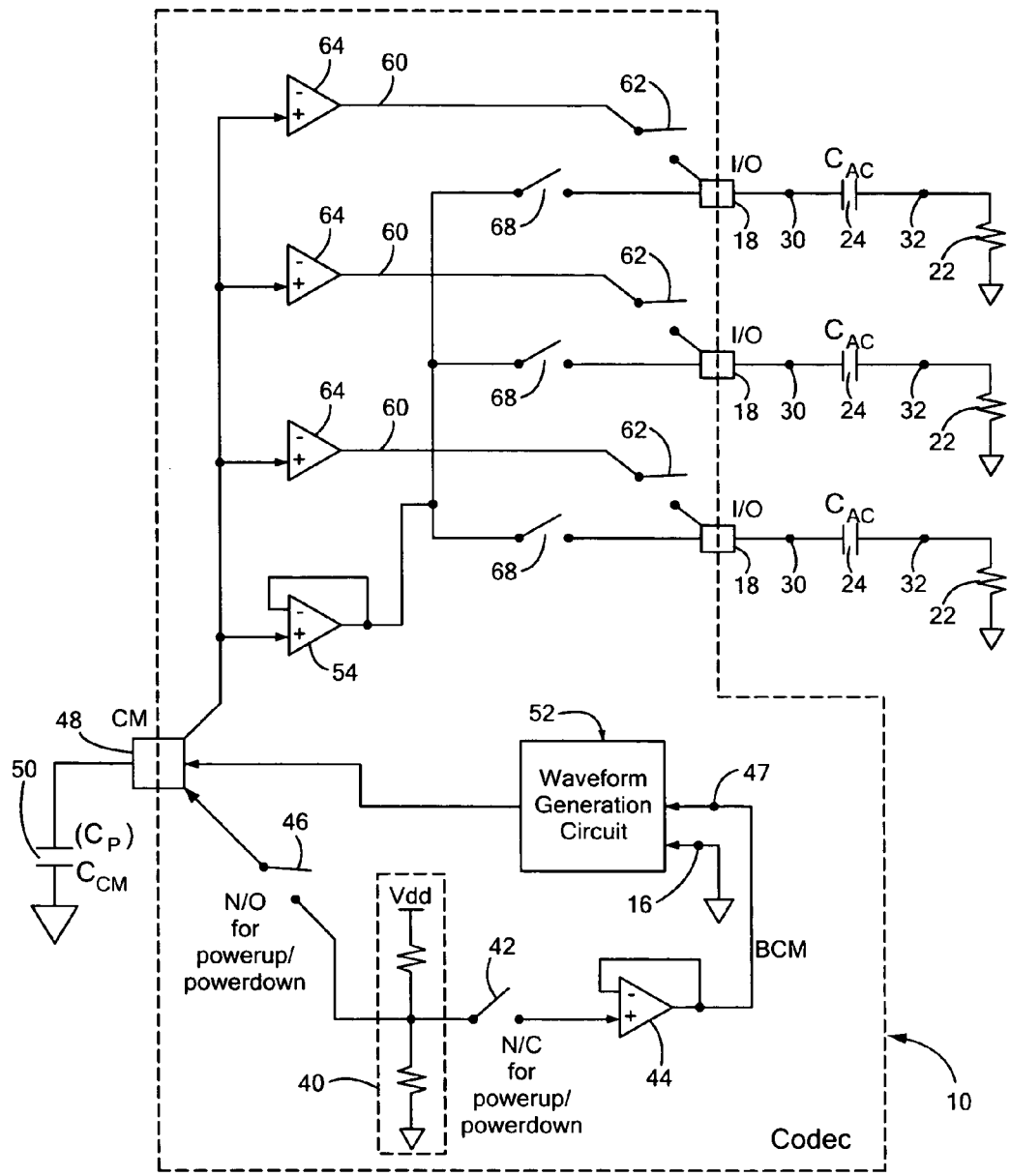
FIG. 2 is a more detailed schematic block diagram of the codec of FIG. 1 showing the waveform generation circuit according to this invention.

In accordance with one construction of this invention, codec 10, FIG. 2, may include a common mode voltage reference circuit 40 which provides a common mode voltage through switch 42 to common mode buffer amplifier 44 and through switch 46 to common mode contact 48 which is connected to common mode capacitor $C_{CM}$ 50. The output of common mode voltage buffer amplifier 44 is delivered to waveform generation circuit 52 as one of two voltage references, the other being a GND voltage from terminal 16. The output of waveform generator circuit 52 connects through contact 48 to capacitor 50 to driver amplifiers 64 and to buffer amplifier 54, which is connected to a number of I/O contacts 22 servicing a number of input/output devices 22, each of which is coupled to its respective contact 18 by an a.c. coupling capacitor $C_{AC}$ 24. In other embodiments, buffer amplifier 54 may include or function as drive amplifier(s) 64. Assuming that each of the input/output devices 22 may be an audio output device and that an abrupt change in voltage across capacitor 24 at nodes 30, 32 would produce an audible click, pop, "whump", or other annoying audible artifact, this codec will act to suppress that artifact, e.g. de-whump.

In operation, assuming a power-up, power-down, or other voltage transition command has occurred, switch 46 will be open and switch 42 will be closed. A common mode voltage will, therefore, be provided through common mode buffer amplifier 44 to waveform generation circuit 52. In accordance with one embodiment of this invention, waveform generation circuit 52 now in conjunction with profile capacitor $C_P$, which in this case is implemented using common mode capacitor $C_{CM}$ 50, generates a waveform which approximates the integral of an idealized current waveform which, when it flows through a.c. coupling capacitor 24 and input/output device 22, is below the audible range, typically 20 to 20 k Hz, so that no audible artifact is heard through the transition from one reference voltage to the other. The integral waveform is thus provided at a selected node 30 to provide a derivative waveform, i.e. current through a.c. coupling capacitor 24 and input/output device 22, which is below the audible range. This is done by shaping the waveform in waveform generation circuit 52 so that its transitions are smooth and of low frequency, i.e. below the audible range. The actual audio signal may be provided on line 60 and selectively applied to contacts 18 . . . through switch 62 from drive amplifier 64. When the actual audio signal is provided, the condition of switches 42 and 46 would be interchanged. The waveform generated by waveform generation circuit 52 is also provided through contacts 18 as explained previously, but it may be done through selection switch 68 through buffer amplifier 54. Buffer amplifier 54 makes it possible for waveform generator 52 to service a number of input/output devices 22 and a.c. coupling capacitors of different load characteristics with much improved levels of crosstalk between the input/output devices 22 when compared to prior art. Thus far in the explanation the integral of the inaudible signal has been used but this is not a necessary limitation of the invention. For example, the inaudible waveform itself may be used and the multi-waveform profile may be a current.

Figure 3:
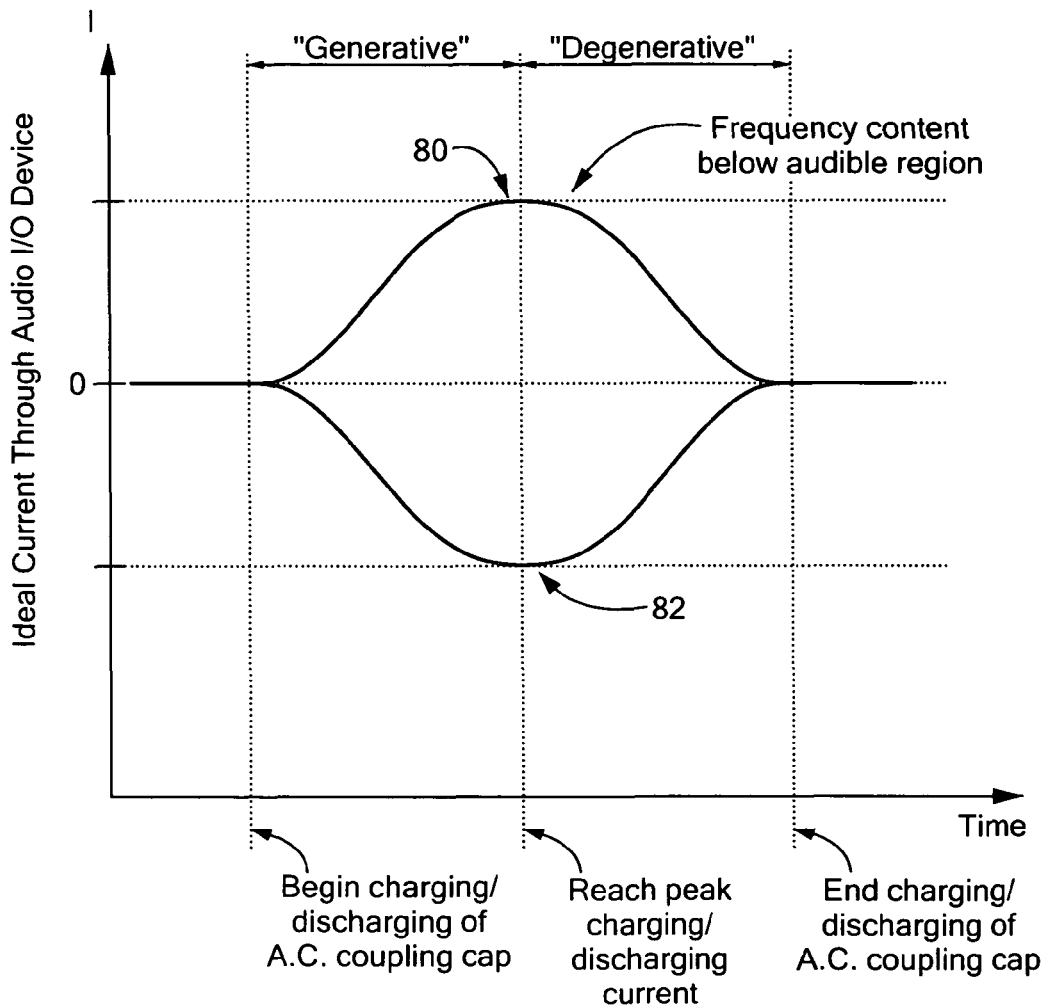
FIG. 3 is an idealized current waveform profile for suppressing audio artifacts from voltage transitions, such as power-up and power-down, at the input/output device according to this invention.
Figure 5:
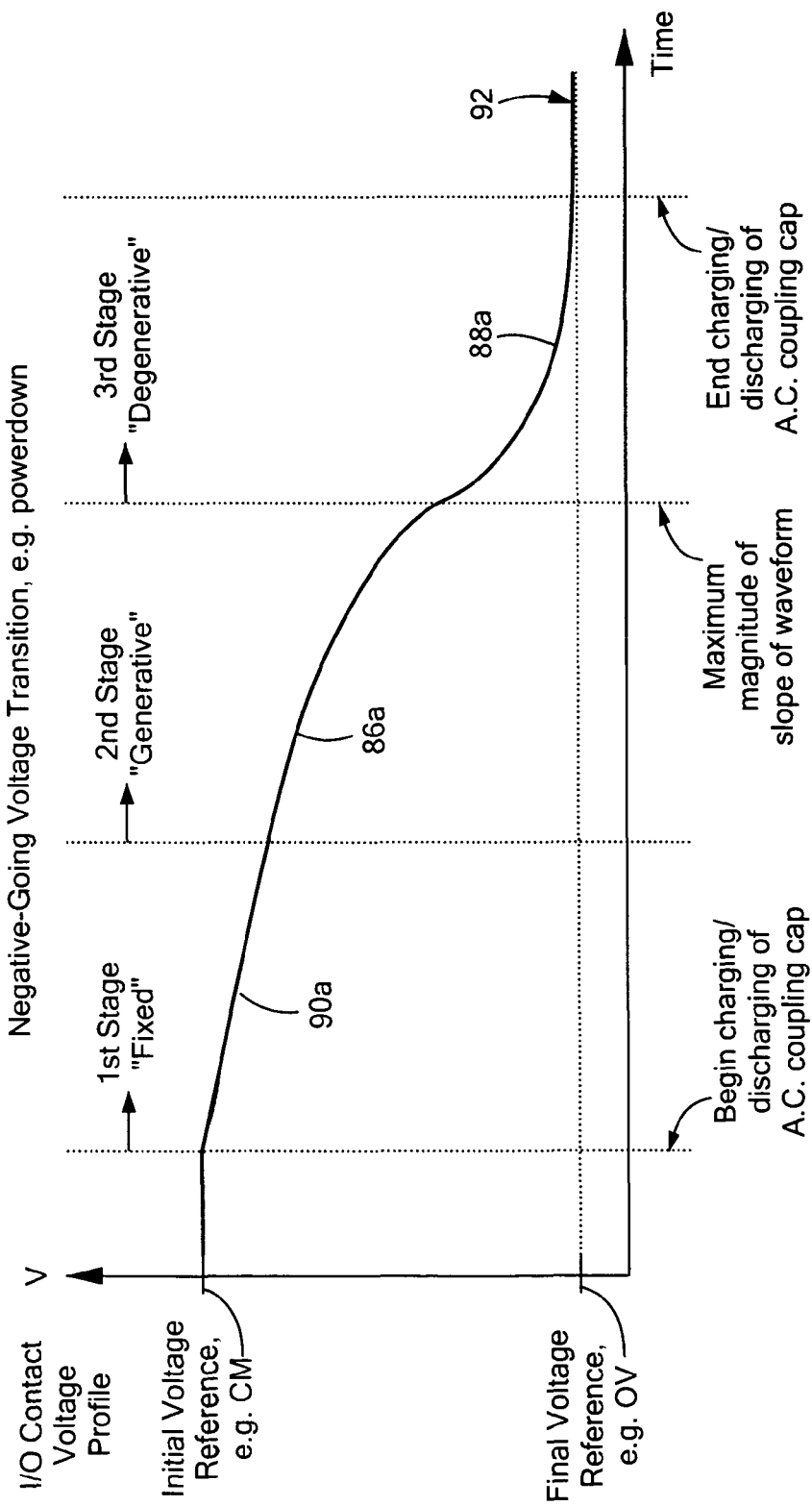
FIG. 5 is a multi-stage voltage waveform that is an approximation of the integral of the current waveform of FIG. 3 for a negative-going voltage transition, such as power-down, for application to the a.c. coupling capacitor which produces the derivative as in FIG. 3.
Figure 6:
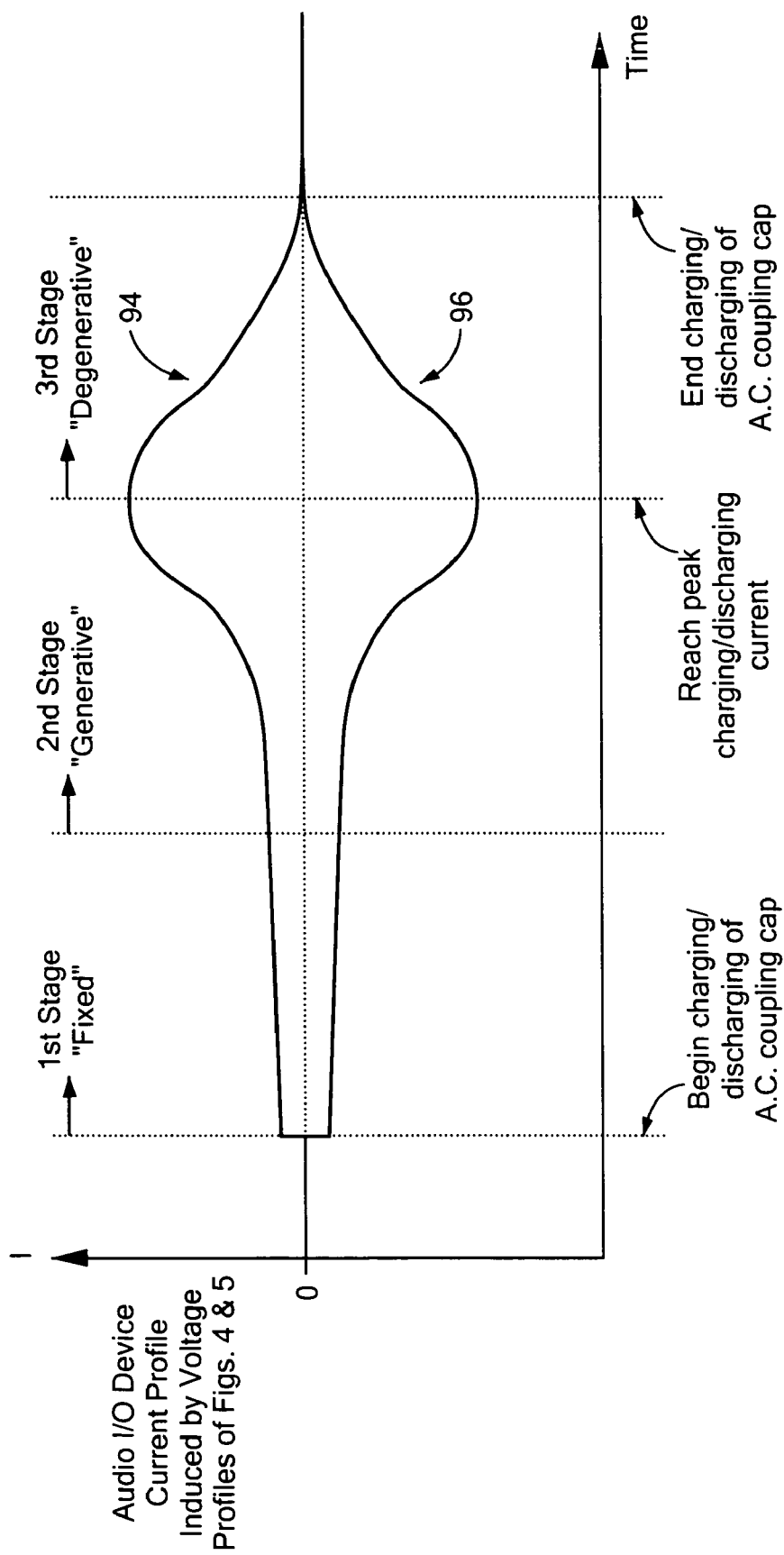
FIG. 6 is the actual current waveform profile for the derivatives of the voltage transition waveforms of FIGS. 4 and 5.

The invention can be better understood with reference to FIG. 3 where there is shown an idealized current waveform 80 which is desired to flow through capacitor 24 and audio input/output device 22. The slow, gradual transitioning of this waveform is controlled to be below the audible range, that is, for example, below 20 Hz. While curve 80 represents the idealized current waveform through capacitor 24 and device 22 at a positive-going voltage transition such as power-up, waveform 82 represents the idealized current waveform through capacitor 24 and device 22 at a negative-going voltage transition such as power-down. Because the current through a capacitor such as capacitor 24 is proportional to the derivative of the voltage across the capacitor and since we intend to only apply the waveform 80, 82 from a stable state of no current in capacitor 24 and device 22 so that node 32 starts at GND, these waveforms constitute the derivative of the waveform on the other side of the coupling capacitor $C_{AC}$ 24 on node 30. Thus, to obtain these idealized waveforms 80, 82, or at least to get as close as possible, this invention uses waveform generation circuit 52 and a profile capacitor to generate an approximation of the integral 84, FIG. 4, of the ideal positive-going transition waveform 80. Note that as explained the inaudible waveform itself may be used and the multi-waveform profile may be a current. Waveform 84 to be presented at node 30 is a multi-stage waveform including at least a generative stage 86 and a degenerative stage 88. With respect to FIG. 3, generally the generative stage will occur when the magnitude of the current waveform rises above zero and increases to its peak and, generally, the degenerative stage extends from this peak and the magnitude of the current decreases back to zero. Referring back to FIG. 4, in the generative stage 86 the magnitude of the slope is increasing, in the degenerative stage 88 it is decreasing. The generative and degenerative stages are basically all that is necessary to generate waveform 80, however, practically, a preliminary fixed stage 90 is employed. This stage is not truly necessary and can be made as short as possible. In the negative-going voltage transition condition, the integral 92, FIG. 5, of waveform 82 also has a generative stage 86a and a degenerative stage 88a. There is also shown the preliminary or fixed stage 90a. Because the waveforms 84, 92, FIGS. 4 and 5, produced by this embodiment of the waveform generation circuit are approximations of the integrals of the ideal current waveforms 80, 82, FIG. 3, one will notice that the actual current waveforms 94, 96, FIG. 6, induced by waveform generation circuit 52 applied at node 30, that are the derivative of the positive-going voltage transition waveform 84 and the negative-going voltage transition waveform 92, respectively, differ slightly from the ideal current waveforms 80, 82. Specifically, the preliminary fixed stages of positive-going voltage transition 90 and negative-going voltage transition 90a produce a small "step" in the actual current waveforms 94, 96, which is not present in the ideal current waveforms 80, 82. This is a limitation imposed by the requirements for this embodiment of the waveform generation circuit 52, such as the restrictions for smaller silicon area used and less power consumed. Other embodiments of the waveform generation circuit 52 may not have this nonideality if they are not similarly limited by their requirements. Thus, by generating a wave which is approximating the integral 84, 92, FIGS. 4 and 5, of the ideal current waveform 80, 82, FIG. 3, an actual current waveform 94, 96, FIG. 6, is realized that suppresses the audibility of voltage transition artifacts. Although in the embodiment the multi-stage waveform profile is disclosed as a voltage and the inaudible waveform as a current these are not necessary limitations of the invention.

Figure 4:
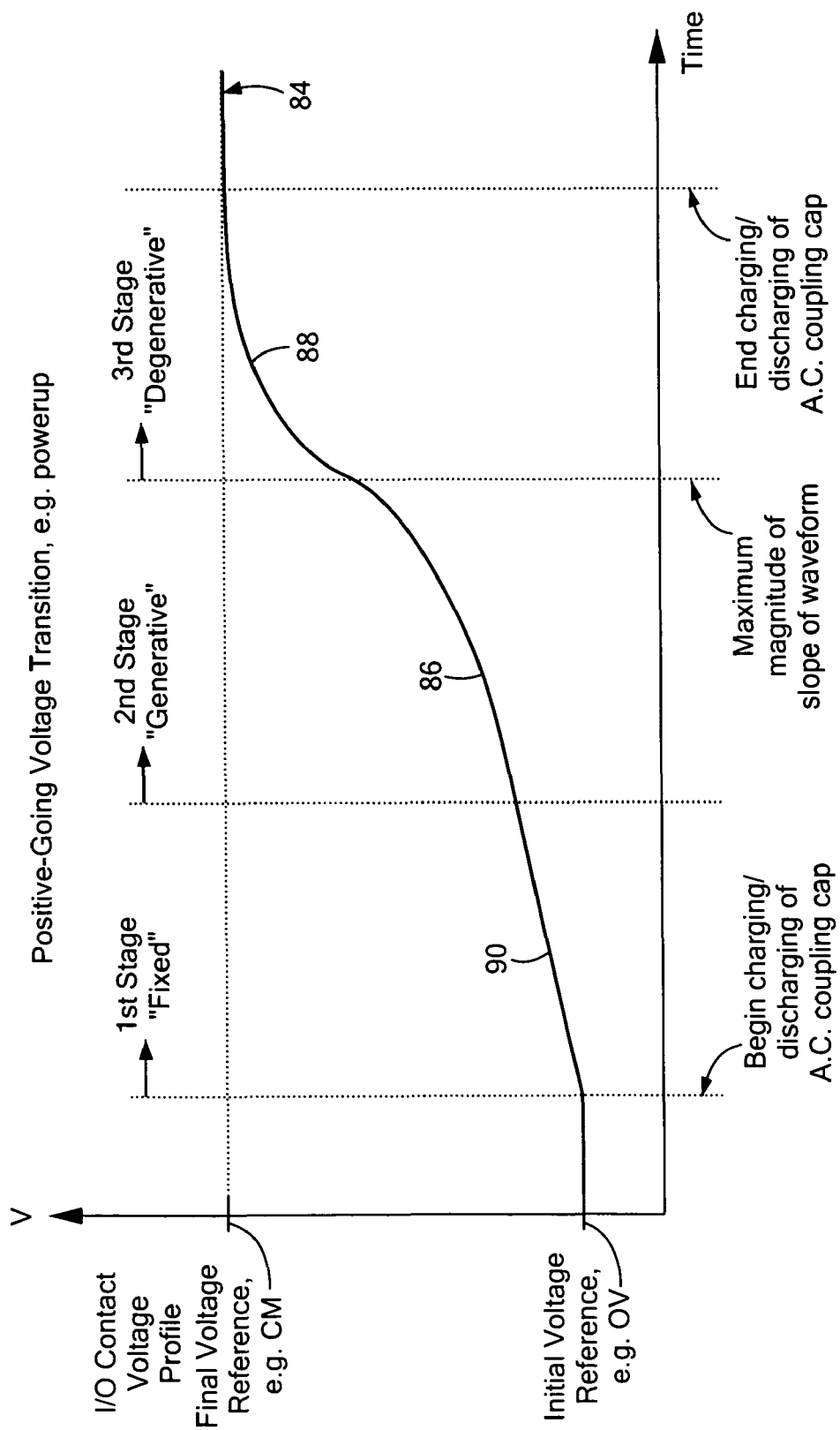
FIG. 4 is a multi-stage voltage waveform that is an approximation of the integral of the current waveform of FIG. 3 for a positive-going voltage transition, such as a power-up for application to the a.c. coupling capacitor which produces the derivative as in FIG. 3.
Figure 7:
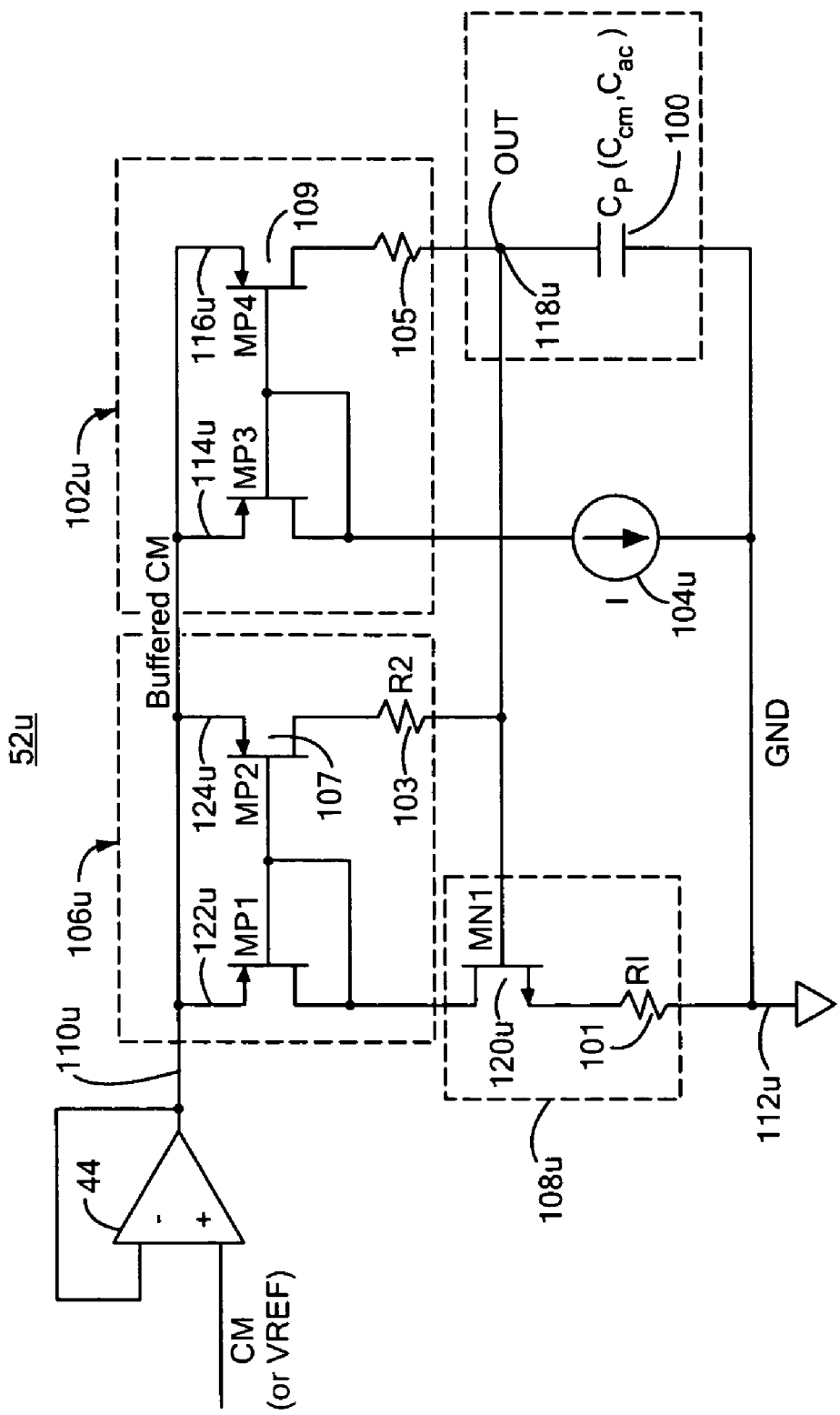
FIG. 7 is a more detailed schematic of the waveform generation circuit of FIG. 2 for a positive-going voltage transition implementation.

In one embodiment, waveform generation circuit 52u, FIG. 7, for a positive-going voltage transition such as a power-up operation, includes a profile capacitor $C_P$ 100, a first current mirror 102u, current source 104u, second current mirror 106u, and positive feedback amplifier 108u. Also provided is a reference voltage 110u such as the buffered common mode voltage and a reference voltage 112u such as ground. In operation, waveform generation circuit at power-up or positive-going voltage transition command will generate the multi-stage integral as shown in FIG. 4 as follows. Leg 114u of current mirror 102u carries a current as indicated by current source 104u. That current is mirrored in leg 116u and charges profile capacitor $C_P$ 100. This is the preliminary stage 90, FIG. 4. Referring again to FIG. 7, as the voltage on node 118u at profile capacitor $C_P$ 100 increases, transistor 120u and positive feedback amplifier 108u turn-on, causing current to flow in leg 122u of current mirror 106u. The mirrored current in leg 124u now adds to the current flowing into profile capacitor $C_P$ 100 through node 118u thereby increasing the slope and inaugurating the generative stage 86, FIG. 4. In the generative stage capacitor 100 ($C_P/C_M/C_{AC}$) and resistor 101 together with transistor 120u produce a frequency control of the audio I/O device current to maintain it at 20 Hz or lower. As the voltage on the profile capacitor $C_P$ 100 continues to increase at node 118u, output legs 116u and 124u of the current mirrors 102u and 106u, respectively, enter the linear region and the waveform enters the degenerative stage 88, FIG. 4. In the degenerative stage capacitor 100 ($C_P/C_M/C_{AC}$) and resistors 103, 105 together with transistors 107, 109 produce a frequency control of the audio I/O device current to maintain it at 20 Hz or lower. While profile capacitor $C_P$ 100 is shown as a separate capacitor here, it may in fact be the common mode capacitor $C_{CM}$ or even the coupling capacitor $C_{AC}$.

Figure 8:
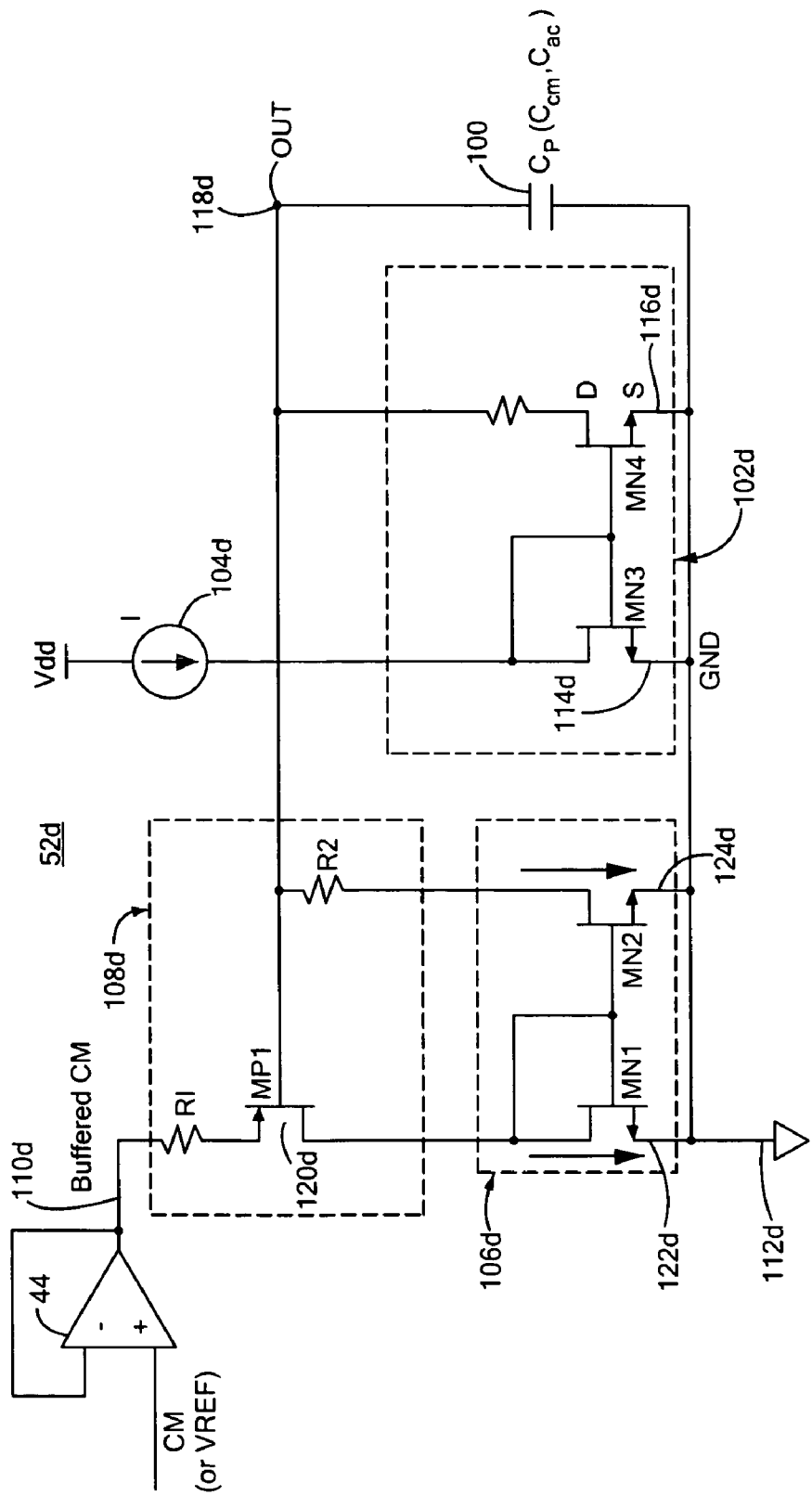
FIG. 8 is a more detailed schematic of the waveform generation circuit of FIG. 2 for a negative-going voltage transition implementation.

In a negative-going voltage transition operation, waveform generation circuit 52*d*, FIG. 8, includes the same components with the exception that the PMOS and NMOS transistors in waveform generation circuit 52*u*, FIG. 7, are swapped with those of waveform generation circuit 52*d*, FIG. 8. That is, the PMOS become NMOS and the NMOS become PMOS and the circuit is inverted with respect to the first and second voltage references. Again the profile capacitor $C_P$ 100 may include the common mode capacitor or the a.c. coupling capacitor. Upon the occurrence of a negative-going voltage transition command, the current flowing from current source 104*d* through leg 114*d* of current mirror 102*d* is mirrored in leg 116*d* of current mirror 102*d*, thus beginning the discharge of profile capacitor 100 as the voltage at node 118*d* decreases. Transistor 120*d* in positive feedback amplifier 108*d* causes current to flow in leg 122*d* of current mirror 106*d*. That current is mirrored in leg 124*d* which adds to and increases the discharge current from profile capacitor 100, thus, moving it from the fixed stage 90*a*, FIG. 5, to the generative stage 86*a*. As the voltage on node 118*d* of profile capacitor 100 continues to decrease, output legs 116*d* and 124*d* of current mirrors 102*d* and 106*d* enter the linear resistance region and the wavefront enters the degenerative stage 88*a*, FIG. 5. The frequency is controlled in a similar fashion in the inverted construction of FIG. 8.

Figure 11:
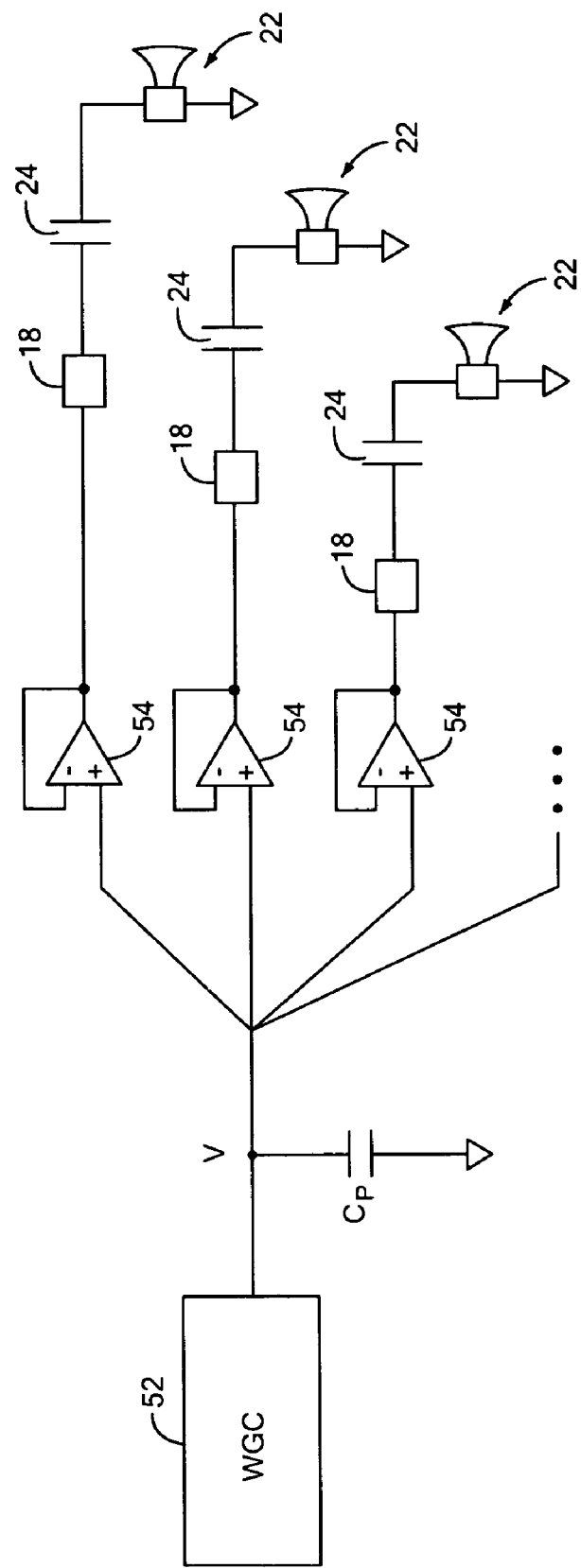
FIG. 11 is a schematic block diagram of the waveform generation circuit of FIGS. 7 and 8 using a single buffer amplifier to service each of a number of input/output devices.

There may be a waveform generation circuit 52 associated with each input/output device 22, FIG. 9. As also shown in FIG. 9, the profile capacitor $C_P$ 100 may be implemented using the a.c. coupling capacitor 24. In other variations, the waveform generation circuit 52, FIG. 10, is allowed to service a number of input/output devices 22 with different loading characteristics. Alternatively, each input/output device 22, FIG. 11, can be serviced by a separate buffer amplifier 54 which is especially appealing when these buffer amplifiers are available and otherwise unused on the codec chip during a voltage transition, such as a drive amplifier.

Figure 12:
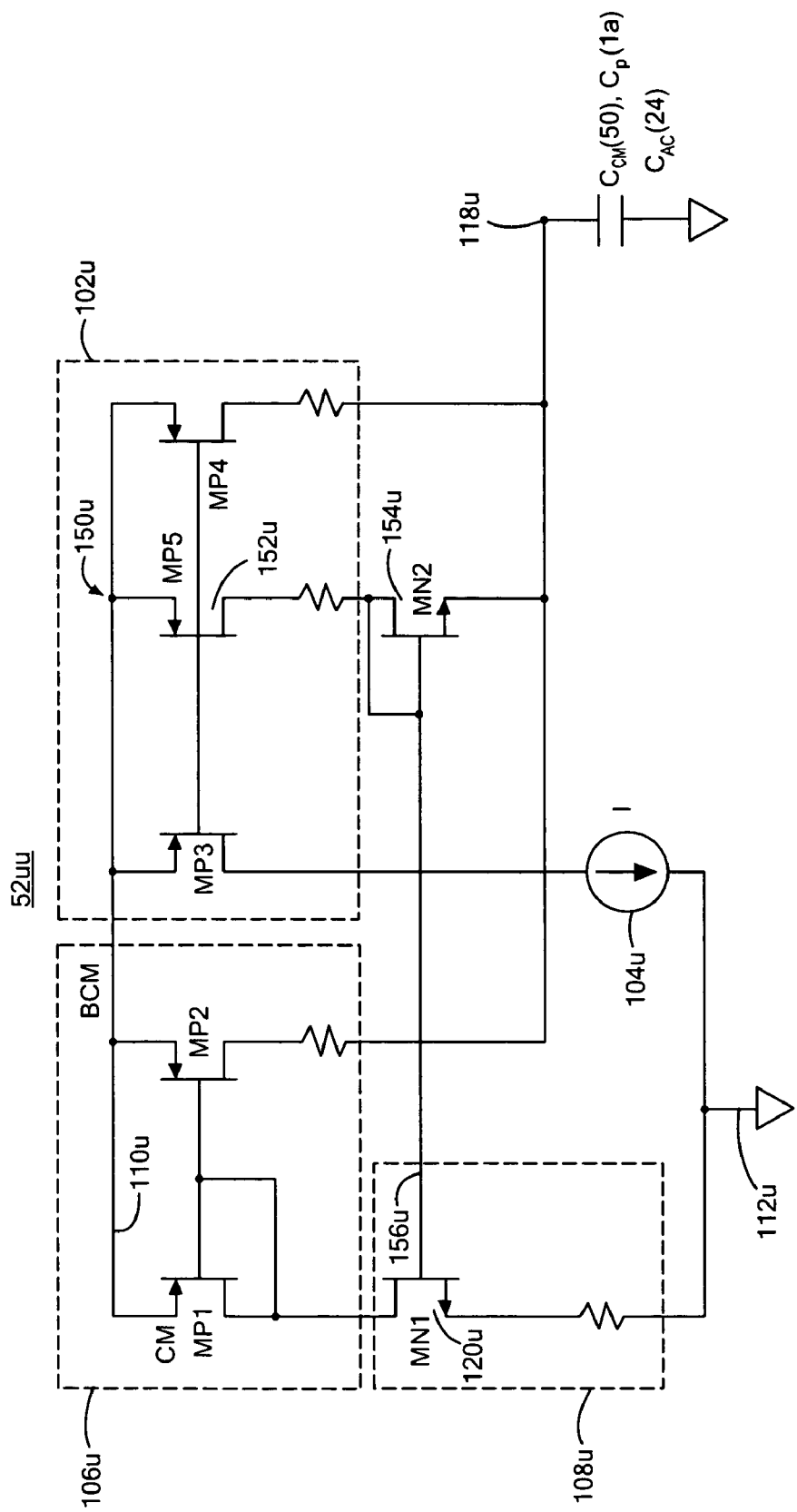
FIG. 12 is a schematic diagram of another embodiment of the waveform generation circuit of FIG. 2 for a positive-going voltage transition with a pre-bias circuit for shortening the period of the preliminary stage.

In the positive-going voltage transition waveform generation circuit 52*u*, FIG. 7, the period of the fixed stage 90, FIG. 4, may be shortened by adding a pre-bias including a positive feedback pre-bias circuit 150*u*, FIG. 12, by adding a third leg 150*u* including PMOS transistor 152*u* and NMOS transistor 154*u* which raises the voltage on gate 156*u* of transistor 120*u* in positive feedback amplifier 108*u*. This causes transistor 120*u* to conduct earlier, moving the waveform generation more quickly from the fixed stage 90 to the generative stage 86, FIG. 4, and thereby desirably shortening the period of fixed stage 90.

Figure 13:
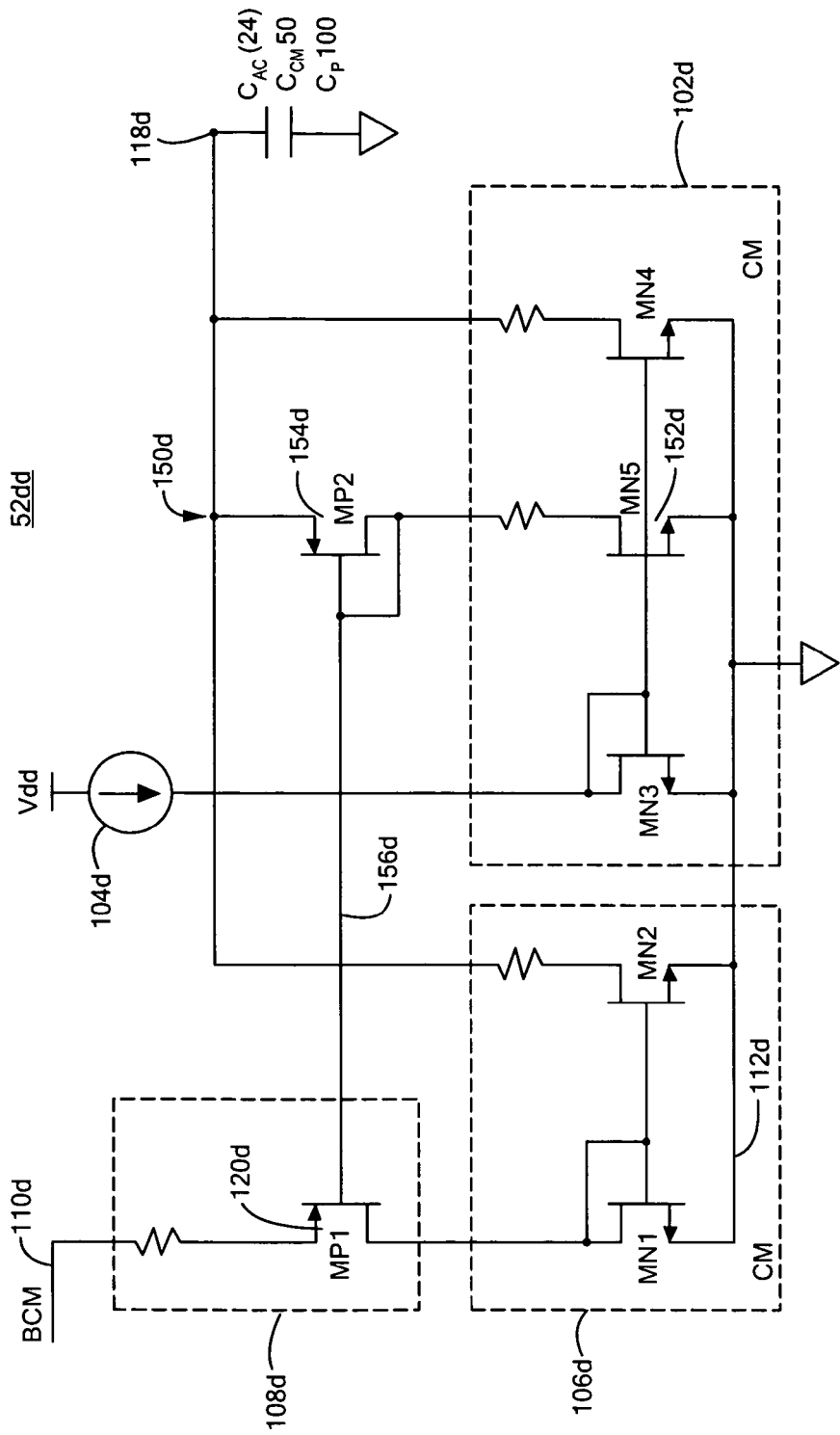
FIG. 13 is a schematic diagram of another embodiment of the waveform generation circuit of FIG. 2 for a negative-going voltage transition with a pre-bias circuit for shortening the period of the preliminary stage.

Similarly, in negative-going voltage transition waveform generation circuit 52*dd*, FIG. 13, the added leg 150*d* includes PMOS transistor 154*d* and NMOS transistor 152*d*. Once again NMOS and PMOS have swapped places from positive-going voltage transition to negative-going voltage transition circuits. In this case, the pre-bias on leg 150*d* lowers the voltage on gate 156*d* of transistor 120*d* in positive feedback amplifier 108*d*. This causes transistor 120*d* to conduct sooner, thereby earlier triggering the generative stage 86*a*, FIG. 5, and shortening the period of the fixed stage 90*a*.

Figure 14:
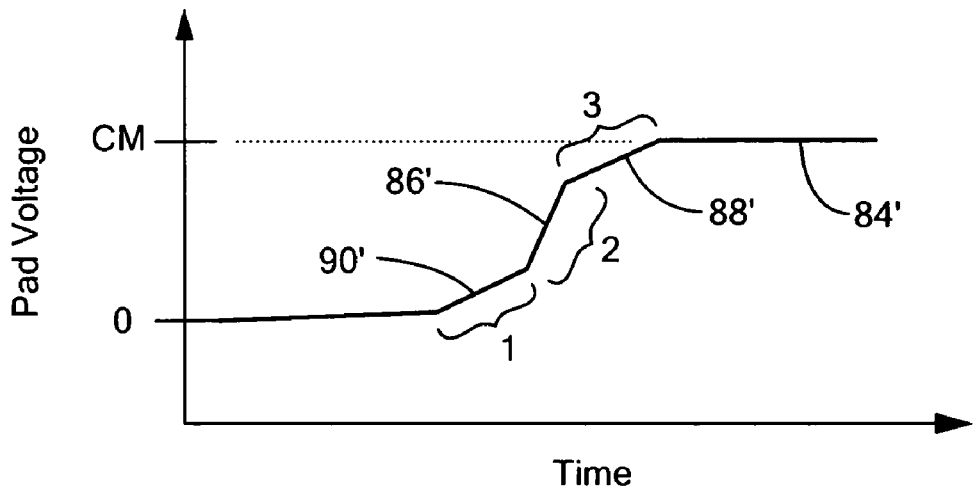
FIG. 14 illustrates another multi-stage voltage waveform integral approximation using different, linear charging.
Figure 15:
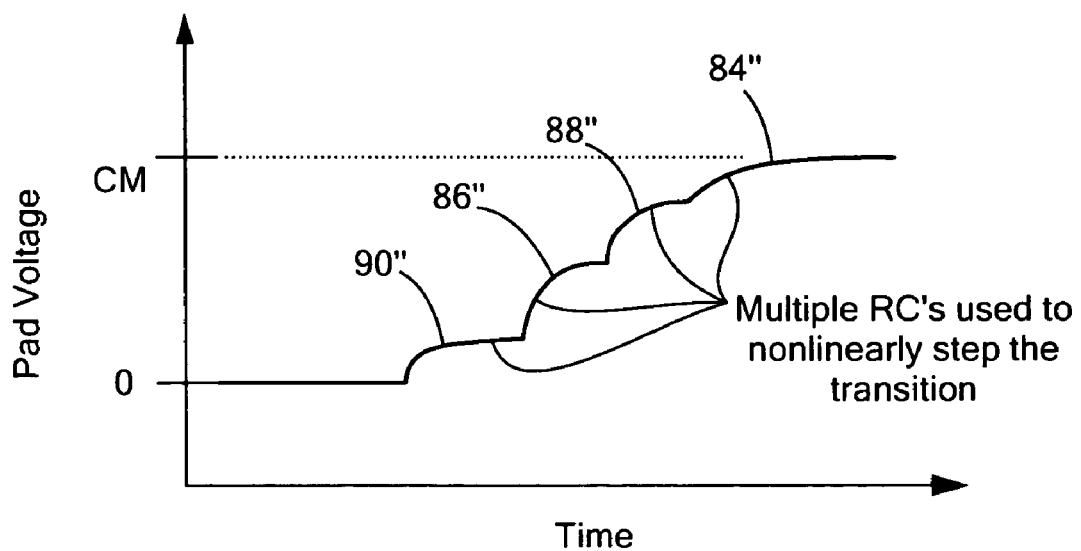
FIG. 15 illustrates another multi-stage voltage waveform integral approximation using different, non-linear charging.

Although waveform generation circuit 52, which generates a multi-stage integral waveform, is shown as generating only a three stage waveform using fixed, generative and degenerative stages, this is not a necessary limitation of the invention. For example, as shown in FIG. 14, waveform 84' may include fixed slope stages such as 90', 86' and 88'. Or as shown in FIG. 15, waveform 84" may include all non-linear stages such as 86", 88", 90". Further the waveform is not limited to two or three or just a few stages, it may have numerous stages. For example, it could be implemented with a digital to analog converter (DAC). That is, in FIG. 2, waveform generation circuit 52 may be a digital to analog converter having hundreds or thousands of steps, for example 28 steps. Those skilled in the art will appreciate that there are a number of ways to effect the approximation be it of a few steps or many, all of which are within the scope of this invention e.g. switched capacitor, switched currents, switched resistors.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A charge/discharge control circuit for controlling current through an input/output audio device comprising:
    a first voltage reference;
    a second voltage reference; and
    a waveform generation circuit responsive to said first and second voltage references for generating a multi-stage waveform profile including a generative stage and a degenerative stage, said multi-stage waveform profile being an inaudible waveform for suppressing audible artifacts in the input/output device, said waveform generation circuit being responsive to a change in voltage by increasing the magnitude of a charging current during said generative stage, and in a degenerative stage responds to further change in voltage by decreasing the magnitude of said charging current.

2. The charge/discharge control circuit of claim 1 in which said first voltage reference includes a common mode voltage.

3. The charge/discharge control circuit of claim 1 in which said second voltage reference includes ground.

4. The charge/discharge control circuit of claim 1 in which the magnitude of the slope of said generative stage increases with time.

5. The charge/discharge control circuit of claim 1 in which the magnitude of the slope of said degenerative stage decreases with time.

6. The charge/discharge control circuit of claim 1 in which said multistage waveform includes a preliminary stage.

7. The charge/discharge control circuit of claim 6 in which said preliminary stage has a fixed slope.

8. The charge/discharge control circuit of claim 1 in which said waveform generation circuit operates a positive-going voltage transitions and the stages of said multistage waveform have positive slope.

9. The charge/discharge control circuit of claim 1 in which said waveform generation circuit operates at negative-going transitions and the stages of said multi-stage waveform have negative slope.

10. The charge/discharge control circuit of claim 1 in which there are a plurality of input/output devices and said waveform generation circuit includes a buffer amplifier associated with all the input/output devices.

11. The charge/discharge control circuit of claim 1 in which there are a plurality of input/output devices and said waveform generation circuit includes a buffer amplifier associated with each of the input/output devices.

12. The charge/discharge control circuit of claim 11 in which said buffer amplifier includes audio drive amplifiers.

13. The charge/discharge control circuit of claim 1 in which said waveform generation circuit includes a digital to analog converter.

14. The charge/discharge control circuit of claim 1 in which said multistage waveform profile is a voltage waveform profile.

15. The charge/discharge control circuit of claim 1 in which said inaudible waveform is a voltage waveform.

16. The charge/discharge control circuit of claim 1 in which said multistage waveform is approximately an integral of an inaudible waveform.

17. The charge/discharge control circuit of claim 1 in which said inaudible waveform is a current waveform profile.

18. The charge/discharge control circuit of claim 1 in which said multi-stage waveform profile is a current waveform profile.

19. The charge/discharge control circuit of claim 1 in which the input/output device includes an a.c. coupling capacitor and said waveform generation circuit includes said a.c. coupling capacitor.

20. A charge/discharge control circuit for controlling current through an input/output audio device comprising:
   a first voltage reference;
   a second voltage reference; and
   a waveform generation circuit responsive to said first and second voltage references for generating a multi-stage waveform profile which is an inaudible waveform for suppressing audible artifacts in the input/output device, said waveform generation circuit operates at positive-going transitions and being responsive to an increase in voltage by increasing the magnitude of a charging current during said generative stage, and in a degenerative stage responds to further elevated voltage by decreasing the magnitude of said charging current.

21. The charge/discharge control circuit of claim 20 in which the input/output device includes an a.c. coupling capacitor and said waveform generation circuit includes said a.c. coupling capacitor.

22. The charge/discharge control circuit of claim 20 further including a positive feedback pre-bias circuit for reducing the period of said preliminary stage.

23. A charge/discharge control circuit for controlling current through an input/output audio device comprising:
   a first voltage reference;
   a second voltage reference; and
   a waveform generation circuit responsive to said first and second voltage references for generating a multi-stage waveform profile which is an inaudible waveform for suppressing audible artifacts in the input/output device, said waveform generation circuit operates at negative-going voltage transitions and being responsive to a decrease in voltage by increasing the magnitude of a discharge current during said generative stage, and in a degenerative stage responds to further decreases in voltage by decreasing the magnitude of said charging current.

24. The charge/discharge control circuit of claim 23 further including a positive feedback pre-bias circuit for reducing the period of said preliminary stage.

* * * * *